Nov. 3, 1970 W. DEITZE 3,538,351

CIRCUIT ARRANGEMENT FOR AN AMPLITUDE EXPANDOR IN THE ELECTRIC TELECOMMUNICATION ENGINEERING

Original Filed April 2, 1966

United States Patent Office 3,538,351
Patented Nov. 3, 1970

3,538,351

CIRCUIT ARRANGEMENT FOR AN AMPLITUDE EXPANDOR IN THE ELECTRIC TELECOMMUNICATION ENGINEERING

Wolfgang Deitze, Stuttgart-Zuffenhausen, Germany, assignor to International Standard Electric Corporation, New York, N.Y., a corporation of Delaware Continuation of application Ser. No. 531,288, Apr. 2, 1966. This application Nov. 10, 1969, Ser. No. 871,544
Claims priority, application Germany, Mar. 10, 1965, St 23,478
Int. Cl. H03f *1/08, 1/30*
U.S. Cl. 307—264 3 Claims

ABSTRACT OF THE DISCLOSURE

An amplitude expandor is formed by a transistor stage coupling to an amplifier stage. The transistor stage responds to received signals to provide an input signal from its emitter and a control signal from its collector. The input signal is applied to the emitter circuits of the amplifier stage and the control signal is rectified and applied to the base of amplifier stage. The amplifier stage then provides the expanded signal.

This application is a continuation of U.S. patent application Ser. No. 531,288 filed April 2, 1966, now abandoned.

To improve the quality of transmission, particularly the signal-to-noise ratio, amplitude compressors and expandors are used, containing a non-linear network. Most of these networks use controlled non-linear resistors. The article "A Compandor using Junction Transistors" by D. Thomson in "The Institution of Electrical Engineers" paper 2868, May 1959, describes such a system, in which transistors are used in the expandor instead of the non-linear resistors, the transistors rendering a different amplification due to a corresponding control. The input signal is there divided through a voltage divider and both required signals are kept each by an element of said voltage divider. Due to the voltage divider it becomes then also necessary to amplify the control signal, and to provide means in order to avoid couplings between these two signals. This results in a relatively high expenditure for the arrangement.

It is the object of the invention to provide an arrangement in which, with a small expenditure, a mode of operation is obtained as exact as possible.

This is achieved, according to the invention, that a transistor input stage furnishes the input signal and, properly decoupled, a signal, serving as control signal, after rectification.

According to a further embodiment of the invention, the signal to be expanded in the transistor stage is applied to the base of a transistor and the input signal is taken off the emitter and the control signal is taken off the collector.

The design of one resistor, according to a further embodiment of the invention, as a temperature-dependent two-terminal network, results in another advantage, viz. that the temperature-voltage of the transistors can be compensated. It is only known from the already mentioned publication, to compensate the change of the residual current of the rectified transistor through temperature influences by the residual current of a similar transistor, which flows in the rectifier circuit in the opposite direction to the control current.

The invention is now in detail explained with the aid of an example shown in the accompanying drawings, wherein.

Figure 1:
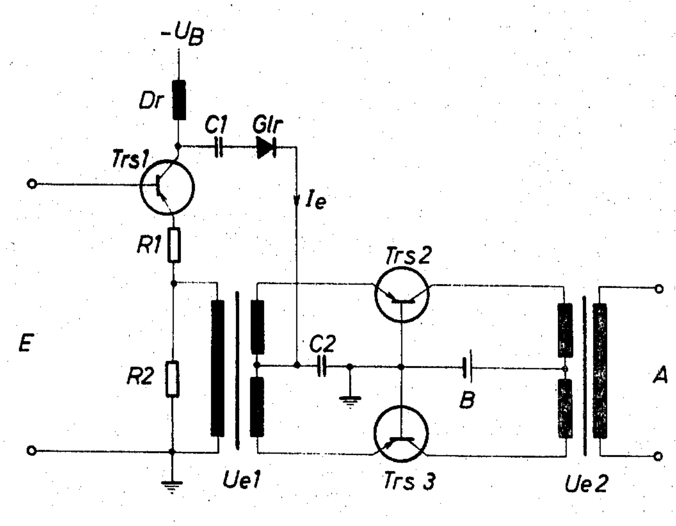
FIG. 1 represents the partly simplified circuit diagram of an expandor.

The signal applied to the input E (FIG. 1) and to be expanded, controls the base of transistor T*rs* 1. The two resistors R1 and R2 inserted in the emitter circuit, determine the ratio of alternating current to direct current in the non-linear network. The resistor R2 represents the required low-ohmic generator resistance for the regulating element. The resistor R1 is essentially larger than the resistor R2, so that resistance changes, in parallel to the resistor R2, do not influence the amplification in the direction of the collector.

The input transformer U*e* 1, for the non-linear network, is in parallel to the resistor R2. The two transistors T*rs* 2 and T*rs* 3, inserted in the series branches actuate as controlled amplifiers. To control the amplification, the signal taken off at the collector is rectified in the rectifier G*lr* and then applied to both the transistors in parallel, thereby regulating the amplification in dependence of the input signal. The thus expanded signal can then be taken off at the output transformer U*e* 2 at the output A.

While the influence of the temperature-dependent residual current can be suppressed in that the operating point is favourably selected, there still remains the dependence of the transconductance of the control transistors from the ambient temperature above the temperature voltage which is described in detail in the following paragraphs.

In order to compensate said effect, the resistor R1 is made as a temperature-dependent two-terminal network. With an increase in temperature, the resistance of resistor R1 becomes smaller and thus also the feedback coupling, thereby enlarging the control current, so that the entire circuit arrangement nearly becomes independent of the temperature.

The temperature voltage $U_T$ of the transistor is determined by the relation:

$$U_T = \frac{k \cdot T}{q} \qquad (1)$$

In this formula $k$ represents the Boltzmann's constant, $q$ is the elementary charge and T the absolute temperature. At a temperature change from 0° C. to 60° C. the temperature voltage changes by the coefficient $$\frac{U_T\ 60°}{U_T\ 0°} = \frac{273+60}{273} = 1.22 \triangleq 0.2\ N \qquad (2)$$

If one transistor is operated at an operating point, in which the transconductance is given by:

$$S = \frac{I_e}{U_T} \qquad (3)$$

it can be seen that, at the constant $I_e$ the change of the temperature voltage causes a change of the transconductance. If the transconductance S shall be independent of the temperature, the current $I_e$ must also be made temperature-dependent.

The transconductance of the push-pull circuit with the transistors T*rs* 2 and T*rs* 3 is given by the Equation 3. With $$I_e \approx \frac{U}{R_1}$$

one obtains $$S \approx \frac{U}{U_T \cdot R1} \qquad (4)$$

For a constant transconductance then applies:

$$R1 = \frac{K}{U_T} = K \cdot \frac{q}{k \cdot T} = K \cdot \frac{q}{k(T_0 + t)} \qquad (5)$$

With $t \ll T_0 = 273°$ C. one obtains then:

$$R1 = K \frac{q}{k \cdot T_o} \left(1 - \frac{t}{T_o}\right)$$

Figure 2:
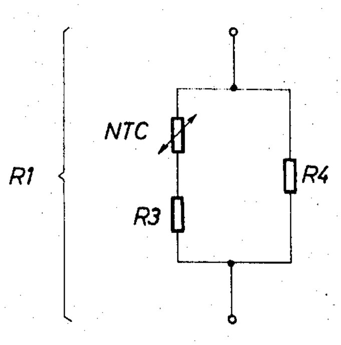
FIG. 2 shows the circuit diagram of the two-terminal network.

If the resistance value R1 is approximated by the circuit shown in FIG. 2 with NTC-resistor and two resistors R3 and R4, the following equation applies, if only the change of the NTC-resistance with the ambient temperature is considered:

$$R3 = -\frac{R_{t1} - R_{t2}}{2} + \sqrt{R_{t1} - R_{t2}} \cdot \sqrt{\frac{R_{t1} - R_{t2}}{4} \cdot \frac{r_1 \cdot r_2}{r_1 - r_2}} \quad (6)$$

$$R4 = -\frac{r_2(R_{t2} + R_{t3})}{R_{t2} + R3 - r_2} \quad (7)$$

In these formulae is:

$R_{t1}$=Resistance value of the NTC-resistor at a temperature $t_1$ $R_{t2}$=Resistance value of the NTC-resistor at a temperature $t_2$ $r_1$=Required resistance value $R_1$ at a temperature $t_1$ $r_2$=Required resistance value $R_1$ at a temperature $t_2$.

I claim:

1. An amplitude expandor comprising a transistor employed in a phase-splitter stage, an amplitude-controlled push-pull amplifier, rectifier means coupled to a collector terminal of the phase-splitter for deriving a DC control voltage, means applying the DC control voltage to control elements of the push-pull amplifier, impedance-matching means for coupling signals from the emitter of the transistor to push-pull amplifier input terminals, means to compensate distortions of the push-pull amplifier output signals effected by temperature variations, said means to compensate including a single temperature-dependent resistor to vary the output signals of the phase-splitter stage in such a manner that the relation between the DC supply- and the AC signal currents flowing in the push-pull amplifier circuitry remains constant when the signal output amplitude is controlled.

2. An arrangement as claimed in claim 1, in which said means to compensate includes a two-terminal resistive network containing the single temperature-dependent resistor, one terminal of said network being connected to the emitter of the phase-splitter transistor, and the other terminal being connected to one terminal of a connection in parallel of the first resistor to the push-pull amplifier input impedance, the second terminal being grounded, the temperature-dependent resistance of the two-terminal network being chosen so that the DC control voltage and the push-pull amplifier input signal are varied in the same sense so that the DC supply to AC-signal currents ratio remains constant, and that impedance variations of the push-pull amplifier input, by controlling said amplifier, do not effect gain variations of the phase-splitter stage.

3. An amplitude expandor arrangement according to claim 2 wherein a second resistor is connected in series with the single temperature-dependent resistor having a negative temperature characteristic, said series connection being in parallel to a third resistor forming said two-terminal resistive network.

References Cited

UNITED STATES PATENTS

| | | | |
|---|---|---|---|
| 1,737,830 | 12/1929 | Crisson | 333—14 |
| 2,233,061 | 2/1941 | Peterson | 333—14 |
| 2,963,656 | 12/1960 | Parris | 307—310 |
| 3,145,349 | 8/1964 | Turrell | 307—310 |
| 3,324,422 | 6/1967 | Luna | 333—14 |
| 3,060,331 | 10/1962 | Habisohn | 307—310 |
| 3,288,930 | 11/1966 | Johnson | 307—237 |

FOREIGN PATENTS

| | | |
|---|---|---|
| 875,063 | 8/1961 | Great Britain. |

DONALD D. FORRER, Primary Examiner

H. A. DIXON, Assistant Examiner

U.S. Cl. X.R.

333—28